US009646827B1

(12) United States Patent
Chakraborty et al.

(10) Patent No.: US 9,646,827 B1
(45) Date of Patent: May 9, 2017

(54) METHOD FOR SMOOTHING SURFACE OF A SUBSTRATE CONTAINING GALLIUM AND NITROGEN

(75) Inventors: Arpan Chakraborty, Goleta, CA (US); Anurag Tyagi, Fremont, CA (US)

(73) Assignee: Soraa, Inc., Fremont, CA (US)

(*) Notice: Subject to any disclaimer, the term of this patent is extended or adjusted under 35 U.S.C. 154(b) by 0 days.

(21) Appl. No.: 13/593,128

(22) Filed: Aug. 23, 2012

Related U.S. Application Data

(60) Provisional application No. 61/526,355, filed on Aug. 23, 2011.

(51) Int. Cl.
  *H01L 33/32* (2010.01)
  *H01L 21/02* (2006.01)
  *H01L 33/00* (2010.01)

(52) U.S. Cl.
  CPC ...... *H01L 21/0254* (2013.01); *H01L 33/0075* (2013.01)

(58) Field of Classification Search
  CPC ....... H01L 21/00; H01L 33/32; H01L 33/005; H01L 21/02002
  USPC .................. 257/13, 76, 99, 201; 438/689
  See application file for complete search history.

(56) References Cited

U.S. PATENT DOCUMENTS

| | | |
|---|---|---|
| 3,647,522 A | 3/1972 | Single |
| 4,065,688 A | 12/1977 | Thornton |
| 4,341,592 A | 7/1982 | Shortes et al. |
| 4,860,687 A | 8/1989 | Frijlink |
| 4,911,102 A | 3/1990 | Manabe et al. |
| 5,331,654 A | 7/1994 | Jewell et al. |
| 5,334,277 A | 8/1994 | Nakamura |
| 5,527,417 A | 6/1996 | Iida et al. |
| 5,647,945 A | 7/1997 | Matsuse et al. |
| 5,663,592 A | 9/1997 | Miyazawa et al. |
| 5,698,880 A | 12/1997 | Takahashi et al. |
| 5,736,753 A | 4/1998 | Ohno et al. |
| 5,813,753 A | 9/1998 | Vriens et al. |
| 5,821,555 A | 10/1998 | Saito et al. |
| 5,864,171 A | 1/1999 | Yamamoto et al. |
| 5,888,907 A | 3/1999 | Tomoyasu et al. |
| 5,951,923 A | 9/1999 | Horie et al. |

(Continued)

FOREIGN PATENT DOCUMENTS

| | | |
|---|---|---|
| CN | 1783525 | 6/2006 |
| CN | 1851942 | 10/2006 |

(Continued)

OTHER PUBLICATIONS

USPTO Office Action for U.S. Appl. No. 12/727,148 dated May 15, 2013.

(Continued)

*Primary Examiner* — John C Ingham
*Assistant Examiner* — Ismail Muse
(74) *Attorney, Agent, or Firm* — Saul Ewing LLP

(57) ABSTRACT

Disclosed is a method for processing GaN based substrate material for manufacturing light-emitting diodes, lasers, and other types of devices. In various embodiments, a GaN substrate is exposed to nitrogen and hydrogen at a high temperature. This process causes the surface of the GaN substrate to anneal and become smooth. Then other processes, such as growing epitaxial layers over the surface of GaN substrate, can be performed over the smooth surface of the GaN substrate.

26 Claims, 6 Drawing Sheets

(56) References Cited

U.S. PATENT DOCUMENTS

| | | |
|---|---|---|
| 6,123,768 A | 9/2000 | Moustakas |
| 6,153,010 A | 11/2000 | Kiyoku et al. |
| 6,239,454 B1 | 5/2001 | Glew et al. |
| 6,451,157 B1 | 9/2002 | Hubacek |
| 6,468,882 B2 | 10/2002 | Motoki et al. |
| 6,489,636 B1 | 12/2002 | Goetz et al. |
| 6,734,461 B1 | 5/2004 | Shiomi et al. |
| 6,755,932 B2 | 6/2004 | Masuda et al. |
| 6,814,811 B2 | 11/2004 | Ose |
| 6,833,564 B2 | 12/2004 | Shen et al. |
| 6,855,959 B2 | 2/2005 | Yamaguchi et al. |
| 6,858,081 B2 | 2/2005 | Biwa et al. |
| 6,875,273 B2 | 4/2005 | Katamine et al. |
| 6,920,166 B2 | 7/2005 | Akasaka et al. |
| 7,053,413 B2 | 5/2006 | D'Evelyn et al. |
| 7,135,348 B2 | 11/2006 | Okuyama et al. |
| 7,208,096 B2 | 4/2007 | Akkipeddi et al. |
| 7,312,156 B2 | 12/2007 | Granneman et al. |
| 7,348,600 B2 | 3/2008 | Narukawa et al. |
| 7,390,359 B2 | 6/2008 | Miyanaga et al. |
| 7,483,466 B2 | 1/2009 | Uchida et al. |
| 7,535,082 B2 | 5/2009 | Nakayama et al. |
| 7,550,305 B2 | 6/2009 | Yamagata et al. |
| 7,555,025 B2 | 6/2009 | Yoshida |
| 7,691,658 B2 | 4/2010 | Kaeding et al. |
| 7,709,284 B2 | 5/2010 | Iza et al. |
| 7,718,454 B2 | 5/2010 | Nakamura et al. |
| 7,727,332 B2 | 6/2010 | Habel et al. |
| 7,749,326 B2 | 7/2010 | Kim et al. |
| 7,786,488 B2 | 8/2010 | Nakayama et al. |
| 7,806,078 B2 | 10/2010 | Yoshida |
| 7,939,354 B2 | 5/2011 | Kyono et al. |
| 7,968,864 B2 | 6/2011 | Akita et al. |
| 8,008,165 B2 | 8/2011 | Nakayama et al. |
| 8,017,932 B2 | 9/2011 | Okamoto et al. |
| 8,153,475 B1 | 4/2012 | Shum et al. |
| 8,247,887 B1 | 8/2012 | Raring et al. |
| 8,268,643 B2 | 9/2012 | Matsumoto |
| 8,293,551 B2 | 10/2012 | Sharma et al. |
| 8,294,179 B1 | 10/2012 | Raring |
| 8,313,964 B2 | 11/2012 | Sharma et al. |
| 8,314,429 B1 | 11/2012 | Raring et al. |
| 8,389,305 B2 | 3/2013 | Felker et al. |
| 8,431,942 B2 | 4/2013 | Butterworth |
| 8,494,017 B2 | 7/2013 | Sharma et al. |
| 8,524,578 B1 | 9/2013 | Raring et al. |
| 8,597,967 B1 | 12/2013 | Krames et al. |
| 8,686,431 B2 | 4/2014 | Batres et al. |
| 8,749,030 B2 | 6/2014 | Raring et al. |
| 8,847,249 B2 | 9/2014 | Raring et al. |
| 2001/0043042 A1 | 11/2001 | Murazaki et al. |
| 2002/0028564 A1 | 3/2002 | Motoki et al. |
| 2002/0085603 A1 | 7/2002 | Okumura |
| 2002/0127824 A1 | 9/2002 | Shelton et al. |
| 2003/0012243 A1 | 1/2003 | Okumura |
| 2003/0020087 A1 | 1/2003 | Goto et al. |
| 2003/0047076 A1 | 3/2003 | Liu |
| 2003/0080345 A1 | 5/2003 | Motoki et al. |
| 2003/0140846 A1 | 7/2003 | Biwa et al. |
| 2003/0200931 A1 | 10/2003 | Goodwin |
| 2004/0025787 A1 | 2/2004 | Selbrede et al. |
| 2004/0060518 A1 | 4/2004 | Nakamura et al. |
| 2004/0080256 A1 | 4/2004 | Hampden-Smith et al. |
| 2004/0089919 A1 | 5/2004 | Motoki et al. |
| 2004/0099213 A1 | 5/2004 | Adomaitis et al. |
| 2004/0116033 A1 | 6/2004 | Ouderkirk et al. |
| 2004/0146264 A1 | 7/2004 | Auner et al. |
| 2004/0151222 A1 | 8/2004 | Sekine |
| 2004/0175939 A1 | 9/2004 | Nakamura et al. |
| 2004/0233950 A1 | 11/2004 | Furukawa et al. |
| 2004/0245543 A1 | 12/2004 | Yoo |
| 2004/0247275 A1 | 12/2004 | Vakhshoori et al. |
| 2004/0262624 A1 | 12/2004 | Akita et al. |
| 2005/0001227 A1 | 1/2005 | Niki et al. |
| 2005/0012446 A1 | 1/2005 | Jermann et al. |
| 2005/0025205 A1 | 2/2005 | Ryowa et al. |
| 2005/0040384 A1 | 2/2005 | Tanaka et al. |
| 2005/0045894 A1 | 3/2005 | Okuyama et al. |
| 2005/0072986 A1 | 4/2005 | Sasaoka |
| 2005/0095861 A1* | 5/2005 | Ueno et al. ............... 438/689 |
| 2005/0139960 A1* | 6/2005 | Shibata ...................... 257/615 |
| 2005/0214992 A1 | 9/2005 | Chakraborty et al. |
| 2005/0218413 A1 | 10/2005 | Matsumoto et al. |
| 2005/0218780 A1 | 10/2005 | Chen |
| 2005/0229855 A1 | 10/2005 | Raaijmakers |
| 2005/0245095 A1 | 11/2005 | Haskell et al. |
| 2006/0033009 A1 | 2/2006 | Kobayashi et al. |
| 2006/0060833 A1 | 3/2006 | Bruckner et al. |
| 2006/0066319 A1 | 3/2006 | Dallenbach et al. |
| 2006/0078022 A1 | 4/2006 | Kozaki et al. |
| 2006/0086319 A1 | 4/2006 | Kasai et al. |
| 2006/0086948 A1 | 4/2006 | Ohno et al. |
| 2006/0097278 A1 | 5/2006 | Goto et al. |
| 2006/0126688 A1 | 6/2006 | Kneissl |
| 2006/0144334 A1 | 7/2006 | Yim et al. |
| 2006/0186418 A1 | 8/2006 | Edmond et al. |
| 2006/0193359 A1 | 8/2006 | Kuramoto |
| 2006/0216416 A1 | 9/2006 | Sumakeris et al. |
| 2006/0240585 A1 | 10/2006 | Epler et al. |
| 2006/0272572 A1 | 12/2006 | Uematsu et al. |
| 2006/0286695 A1 | 12/2006 | Yanashima et al. |
| 2007/0045200 A1 | 3/2007 | Moon et al. |
| 2007/0081857 A1 | 4/2007 | Yoon |
| 2007/0093073 A1 | 4/2007 | Farrell et al. |
| 2007/0101932 A1 | 5/2007 | Schowalter et al. |
| 2007/0110112 A1 | 5/2007 | Sugiura |
| 2007/0111488 A1 | 5/2007 | Chakraborty et al. |
| 2007/0153866 A1 | 7/2007 | Shchegrov et al. |
| 2007/0163490 A1 | 7/2007 | Habel et al. |
| 2007/0184637 A1 | 8/2007 | Haskell et al. |
| 2007/0242716 A1 | 10/2007 | Samal et al. |
| 2007/0259464 A1 | 11/2007 | Bour et al. |
| 2007/0280320 A1 | 12/2007 | Feezell et al. |
| 2008/0001165 A1 | 1/2008 | Hashimoto et al. |
| 2008/0001174 A1* | 1/2008 | Shibata ...................... 257/201 |
| 2008/0030976 A1 | 2/2008 | Murazaki et al. |
| 2008/0081015 A1 | 4/2008 | Sarayama et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0151543 A1 | 6/2008 | Wang |
| 2008/0173735 A1 | 7/2008 | Mitrovic et al. |
| 2008/0198881 A1 | 8/2008 | Farrell et al. |
| 2008/0232416 A1 | 9/2008 | Okamoto et al. |
| 2008/0251020 A1 | 10/2008 | Franken et al. |
| 2008/0257256 A1* | 10/2008 | Melnik et al. ................ 117/84 |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0066241 A1 | 3/2009 | Yokoyama |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0086475 A1 | 4/2009 | Caruso et al. |
| 2009/0141765 A1 | 6/2009 | Kohda et al. |
| 2009/0153752 A1 | 6/2009 | Silverstein |
| 2009/0155989 A1 | 6/2009 | Uematsu et al. |
| 2009/0159869 A1 | 6/2009 | Ponce et al. |
| 2009/0229519 A1 | 9/2009 | Saitoh |
| 2009/0309110 A1 | 12/2009 | Raring et al. |
| 2009/0309127 A1 | 12/2009 | Raring et al. |
| 2009/0315965 A1 | 12/2009 | Yamagata et al. |
| 2009/0316116 A1 | 12/2009 | Melville et al. |
| 2010/0006546 A1 | 1/2010 | Young et al. |
| 2010/0006876 A1 | 1/2010 | Moteki et al. |
| 2010/0031875 A1 | 2/2010 | D'Evelyn |
| 2010/0032644 A1* | 2/2010 | Akita et al. ................... 257/13 |
| 2010/0133656 A1* | 6/2010 | Hager et al. ................ 257/615 |
| 2010/0140745 A1 | 6/2010 | Khan et al. |
| 2010/0163887 A1* | 7/2010 | Kim et al. ..................... 257/76 |
| 2010/0187540 A1* | 7/2010 | Ishibashi et al. ............. 257/76 |
| 2010/0195687 A1 | 8/2010 | Okamoto et al. |

(56) References Cited

U.S. PATENT DOCUMENTS

| | | | |
|---|---|---|---|
| 2010/0213439 A1* | 8/2010 | Ueno | B82Y 20/00 257/13 |
| 2010/0220262 A1 | 9/2010 | DeMille et al. | |
| 2010/0288190 A1 | 11/2010 | Zhang et al. | |
| 2010/0295088 A1* | 11/2010 | D'Evelyn et al. | 257/99 |
| 2010/0309943 A1 | 12/2010 | Chakraborty et al. | |
| 2010/0320462 A1* | 12/2010 | Koukitu et al. | 257/49 |
| 2010/0327291 A1 | 12/2010 | Preble et al. | |
| 2011/0056429 A1 | 3/2011 | Raring et al. | |
| 2011/0057205 A1 | 3/2011 | Mueller et al. | |
| 2011/0075694 A1 | 3/2011 | Yoshizumi et al. | |
| 2011/0129669 A1 | 6/2011 | Fujito et al. | |
| 2011/0164637 A1 | 7/2011 | Yoshizumi et al. | |
| 2011/0177631 A1 | 7/2011 | Gardner et al. | |
| 2011/0203514 A1 | 8/2011 | Pimputkar et al. | |
| 2011/0216795 A1 | 9/2011 | Hsu et al. | |
| 2011/0247556 A1 | 10/2011 | Raring et al. | |
| 2011/0315999 A1 | 12/2011 | Sharma et al. | |
| 2012/0068188 A1* | 3/2012 | Feigelson | H01L 21/324 257/76 |
| 2012/0135553 A1 | 5/2012 | Felker et al. | |
| 2012/0187366 A1* | 7/2012 | Yoon | H01L 21/0237 257/13 |
| 2012/0314398 A1 | 12/2012 | Raring et al. | |
| 2013/0016750 A1 | 1/2013 | Raring et al. | |
| 2013/0022758 A1 | 1/2013 | Trottier | |
| 2013/0044782 A1 | 2/2013 | Raring | |
| 2013/0075770 A1 | 3/2013 | Chakraborty et al. | |
| 2014/0103356 A1 | 4/2014 | Krames et al. | |
| 2014/0346524 A1 | 11/2014 | Batres et al. | |

FOREIGN PATENT DOCUMENTS

| | | |
|---|---|---|
| CN | 101944480 | 1/2011 |
| JP | 03-287770 | 12/1991 |
| JP | 06-508000 | 10/1992 |
| JP | 11-340507 | 12/1999 |
| JP | 2000-082676 | 3/2000 |
| JP | 2000-223743 | 8/2000 |
| JP | 2002-252371 | 9/2002 |
| JP | 2003-060318 | 2/2003 |
| JP | 2004-207519 | 7/2004 |
| JP | 2004-536450 | 12/2004 |
| JP | 2005-235908 | 9/2005 |
| JP | 2005-244226 | 9/2005 |
| JP | 2006-066869 | 3/2006 |
| JP | 2006-093683 | 4/2006 |
| JP | 2003-101081 | 5/2006 |
| JP | 2006-156958 | 6/2006 |
| JP | 2006-279025 | 10/2006 |
| JP | 2006-308858 | 11/2006 |
| JP | 2007-173467 | 7/2007 |
| JP | 2007-537600 | 12/2007 |
| JP | 2008-010749 | 1/2008 |
| JP | 2008-091488 | 4/2008 |
| JP | 2008-159606 | 7/2008 |
| JP | 2009-038220 | 2/2009 |
| JP | 2009-526379 | 7/2009 |
| JP | 2002-084040 | 2/2010 |
| JP | 2006-036561 | 7/2010 |
| JP | 2010-219490 | 9/2010 |
| JP | 2005-129896 | 11/2010 |
| JP | 2006-257290 | 12/2010 |
| JP | 2007-251214 | 4/2011 |
| JP | 2007-188962 | 7/2011 |
| JP | 2007-184352 | 11/2011 |
| WO | WO 2008/041521 | 4/2008 |
| WO | WO 2011/022699 | 2/2011 |

OTHER PUBLICATIONS

USPTO Office Action for U.S. Appl. No. 12/482,440 dated Feb. 23, 2011.
USPTO Office Action for U.S. Appl. No. 12/482,440 dated Aug. 12, 2011.
USPTO Office Action for U.S. Appl. No. 12/484,924 dated Apr. 14, 2011.
USPTO Office Action for U.S. Appl. No. 12/484,924 dated Oct. 31, 2011.
USPTO Office Action for U.S. Appl. No. 12/573,820 dated Mar. 2, 2011.
USPTO Office Action for U.S. Appl. No. 12/573,820 dated Oct. 11, 2011.
USPTO Office Action for U.S. Appl. No. 12/859,153 dated Feb. 26, 2013.
Franssila, 'Tools for CVD and Epitaxy', Introduction to Microfabrication, 2004, pp. 329-336.
USPTO Office Action for U.S. Appl. No. 12/859,153 dated Sep. 25, 2012.
Communication from the Chinese Patent Office re 2010800458819 dated Feb. 27, 2014, 2 pages.
USPTO Office Action for U.S. Appl. No. 12/482,440 dated Feb. 13, 2014, 7 pages.
USPTO Office Action for U.S. Appl. No. 12/484,924 dated Dec. 18, 2013, 15 pages.
USPTO Office Action for U.S. Appl. No. 12/573,820 dated Oct. 9, 2013, 28 pages.
USPTO Office Action for U.S. Appl. No. 12/727,148 dated Nov. 21, 2013, 9 pages.
USPTO Office Action for U.S. Appl. No. 13/046,565 dated Nov. 7, 2011, 16 pages.
USPTO Office Action for U.S. Appl. No. 13/046,565 dated Feb. 2, 2012, 16 pages.
USPTO Office Action for U.S. Appl. No. 13/046,565 dated Apr. 13, 2012, 39 pages.
USPTO Office Action for U.S. Appl. No. 13/046,565 dated Jul. 19, 2012, 23 pages.
USPTO Office Action for U.S. Appl. No. 13/621,485 dated Oct. 8, 2013, 6 pages.
USPTO Notice of Allowance for U.S. Appl. No. 13/621,485 dated Feb. 4, 2014, 7 pages.
Communication from the Japanese Patent Office re 2012-079345 dated Jul. 4, 2013, 15 pages.
USPTO Office Action for U.S. Appl. No. 12/482,440 dated Aug. 15, 2013, 8 pages.
USPTO Office Action for U.S. Appl. No. 12/859,153 dated Jun. 21, 2013, 24 pages.
USPTO Office Action for U.S. Appl. No. 12/482,440 dated Feb. 13, 2014 (7 pages).
USPTO Office Action for U.S. Appl. No. 12/484,924 dated Dec. 18, 2013 (15 pages).
USPTO Notice of Allowance for U.S. Appl. No. 12/484,924 dated May 29, 2014 (8 pages).
USPTO Notice of Allowance for U.S. Appl. No. 13/621,485 dated Feb. 4, 2014 (7 pages).
Communication from the Japanese Patent Office re 2012-525744 dated Jun. 18, 2014 (14 pages).
Communication from the Chinese Patent Office re 2011522148 dated Jul. 9, 2014 (7 pages).
USPTO Office Action for U.S. Appl. No. 12/482,440 dated Sep. 11, 2014 (8 pages).
USPTO Office Action for U.S. Appl. No. 12/727,148 dated Sep. 11, 2014 (11 pages).
USPTO Office Action for U.S. Appl. No. 13/431,834 dated Sep. 3, 2014 (10 pages).
Abare, 'Cleaved and Etched Facet Nitride Laser Diodes', IEEE Journal of Selected Topics in Quantum Electronics, vol. 4, No. 3, 1998, pp. 505-509.
Aoki et al., 'InGaAs/InGaAsP MQW Electroabsorption Modulator Integrated With a DFB Laser Fabricated by Band-Gap Energy Control Selective Area MOCVD', IEEE Journal of Quantum Electronics, vol. 29, 1993, pp. 2088-2096.
Asano et al., '100-mW Kink-Free Blue-Violet Laser Diodes With Low Aspect Ratio', IEEE Journal of Quantum Electronics, vol. 39, No. 1, 2003, pp. 135-140.

(56) References Cited

OTHER PUBLICATIONS

Bernardini et al., 'Spontaneous Polarization and Piezoelectric Constants of III-V Nitrides', Physical Review B, vol. 56, No. 16, 1997, pp. R10-024-R10-027.

Caneau et al., 'Studies on Selective OMVPE of (Ga,In)/(As,P)', Journal of Crystal Growth, vol. 124, 1992, pp. 243-248.

Chen et al., 'Growth and Optical Properties of Highly Uniform and Periodic InGaN Nanostructures', Advanced Materials, vol. 19, 2007, pp. 1707-1710.

Founta et al., 'Anisotropic Morphology of Nonpolar a-Plane GaN Quantum Dots and Quantum Wells', Journal of Applied Physics, vol. 102, vol. 7, 2007, pp. 074304-1-074304-6.

Funato et al., 'Blue, Green, and Amber InGaN/GaN Light-Emitting Diodes on Semipolar (1122) GaN Bulk Substrates', Japanese Journal of Applied Physics, vol. 45, No. 26, 2006, pp. L659-L662.

Funato et al., 'Monolithic Polychromatic Light-Emitting Diodes Based on InGaN Microfacet Quantum Wells Toward Tailor-Made Solid-State Lighting', Applied Physics Express, vol. 1, 2008, pp. 011106-1-011106-3.

Hiramatsu et al., 'Selective Area Growth and Epitaxial Lateral Overgrowth of GaN by Metalorganic Vapor Phase Epitaxy and Hydride Vapor Phase Epitaxy', Materials Science and Engineering, vol. B59, 1999, pp. 104-111.

Khan, 'Cleaved Cavity Optically Pumped InGaN—GaN Laser Grown on Spinel Substrates', Applied Physics Letters, vol. 69, No. 16, 1996, pp. 2417-2420.

Kuramoto et al., 'Novel Ridge-Type InGaN Multiple-Quantum-Well Laser Diodes Fabricated by Selective Area Re-Growth on n-GaN Substrates', Japanese Journal of Applied Physics, vol. 40, 2001, pp. L925-L927.

Lin et al., 'Influence of Separate Confinement Heterostructure Layer on Carrier Distribution in InGaAsP Laser Diodes With Nonidentical Multiple Quantum Wells', Japanese Journal of Applied Physics, vol. 43, No. 10, 2004, pp. 7032-7035.

Nakamura et al., 'InGaN/Gan/AlGaN-Based Laser Diodes With Modulation-Doped Strained-Layer Superlattices Grown on an Epitaxially Laterally Overgrown GaN Substrate', Applied Physics Letters, vol. 72, No. 2, 1998, pp. 211-213.

Nam et al., 'Lateral Epitaxial Overgrowth of GaN Films on SiO2 Areas Via Metalorganic Vapor Phase Epitaxy', Journal of Electronic Materials, vol. 27, No. 4, 1998, pp. 233-237.

Okamoto et al., 'Pure Blue Laser Diodes Based on Nonpolar m-Plane Gallium Nitride With InGaN Waveguiding Layers', Japanese Journal of Applied Physics, vol. 46, No. 35, 2007, pp. L820-L822.

Okamoto et al., 'High-Efficiency Continuous-Wave Operation of Blue-Green Laser Diodes Based on Nonpolar mPlane Gallium Nitride', The Japan Society of Applied Physics, Applied Physics, Express 1, 2008, pp. 072201-1-072201-3.

Okubo, 'Nichia Develops Blue-Green Semiconductor Laser With 488 nm Wavelength', http://techon.nikkeibp.co.jp/english/ NEWS_EN/20080122/146009, 2008.

Park, 'Crystal Orientation Effects on Electronic Properties of Wurtzite InGaN/GaN Quantum Wells', Journal of Applied Physics, vol. 91, No. 12, 2002, pp. 9903-9908.

International Search Report of PCT Application No. PCT/US2009/047107, dated Sep. 29, 2009, 14 pages total.

International Search Report & Written Opinion of PCT Application No. PCT/US2010/030939, dated Jun. 16, 2010, 9 pages total.

International Search Report & Written Opinion of PCT Application No. PCT/US2010/049172, dated Nov. 17, 2010, 7 pages total.

International Search Report of PCT Application No. PCT/US2011/037792, dated Sep. 8, 2011, 2 pages total.

Purvis, 'Changing the Crystal Face of Gallium Nitride', The Advance Semiconductor Magazine, vol. 18, No. 8, 2005, pp. 1-3.

Romanov et al., 'Strain-Induced Polarization in Wurtzite III-Nitride Semipolar Layers', Journal of Applied Plysics, vol. 100, 2006, pp. 023522-1 through 023522-10.

Sato et al., 'High Power and High Efficiency Green Light Emitting Diode on Free-Standing Semipolar (1122) Bulk GaN Substrate', Physica Status Solidi (RRL), vol. 1, No. 4, 2007, pp. 162-164.

Schmidt et al., 'Demonstration of Nonpolar m-Plane InGaN/GaN Laser Diodes', Japanese Journal of Applied Physics, vol. 46, No. 9, 2007, pp. L190-L191.

Schoedl, 'Facet Degradation of GaN Heterostructure Laser Diodes', Journal of Applied Physics, vol. 97, issue 12, 2006, pp. 123102-1-123102-8.

Uchida et al., 'Recent Progress in High-Power Blue-Violet Lasers', IEEE Journal of Selected Topics in Quantum Electronics, vol. 9, No. 5, 2003, pp. 1252-1259.

Waltereit et al., 'Nitride Semiconductors Free of Electrostatic Fields for Efficient White Light-Emitting Diodes', Letters to Nature: International Weekly Journal of Science, vol. 406, 2000, pp. 865-868.

Yu et al., 'Multiple Wavelength Emission From Semipolar InGaN/GaN Quantum Wells Selectively Grown by MOCVD', Optical Society of America, 2007, pp. 1-2.

USPTO Office Action for U.S. Appl. No. 12/491,169 dated Oct. 22, 2010 (9 pages).

USPTO Office Action for U.S. Appl. No. 12/491,169 dated May 11, 2011 (9 pages).

USPTO Office Action for U.S. Appl. No. 12/502,058 dated Dec. 8, 2010 (14 pages).

USPTO Office Action for U.S. Appl. No. 12/502,058 dated Aug. 19, 2011 (12 pages).

USPTO Notice of Allowance for U.S. Appl. No. 12/502,058 dated Apr. 16, 2012 (10 pages).

USPTO Office Action for U.S. Appl. No. 12/749,466 dated Jun. 29, 2011 (19 pages).

USPTO Office Action for U.S. Appl. No. 12/749,466 dated Feb. 3, 2012 (14 pages).

USPTO Office Action for U.S. Appl. No. 12/759,273 dated Nov. 21, 2011 (9 pages).

USPTO Office Action for U.S. Appl. No. 12/762,269 dated Oct. 12, 2011 (11 pages).

USPTO Notice of Allowance for U.S. Appl. No. 12/762,269 dated Apr. 23, 2012 (8 pages).

USPTO Office Action for U.S. Appl. No. 12/762,271 dated Dec. 23, 2011 (11 pages).

USPTO Office Action for U.S. Appl. No. 12/762,271 dated Jun. 6, 2012 (12 pages).

USPTO Notice of Allowance for U.S. Appl. No. 12/762,278 dated Nov. 7, 2011 (10 pages).

USPTO Office Action for U.S. Appl. No. 12/778,718 dated Nov. 25, 2011 (11 pages).

USPTO Notice of Allowance for U.S. Appl. No. 12/778,718 dated Apr. 3, 2012 (13 pages).

USPTO Notice of Allowance for U.S. Appl. No. 12/778,718 dated Jun. 13, 2012 (7 pages).

USPTO Office Action for U.S. Appl. No. 12/789,303 dated Sep. 24, 2012 (19 pages).

USPTO Office Action for U.S. Appl. No. 12/858,379 dated Apr. 14, 2011 (6 pages).

USPTO Notice of Allowance for U.S. Appl. No. 12/858,379 dated Dec. 6, 2011 (9 pages).

USPTO Office Action for U.S. Appl. No. 12/868,441 dated Apr. 30, 2012 (11 pages).

USPTO Office Action for U.S. Appl. No. 12/883,093 dated Mar. 13, 2012 (9 pages).

USPTO Notice of Allowance for U.S. Appl. No. 12/883,093 dated Nov. 21, 2012 (12 pages).

USPTO Office Action for U.S. Appl. No. 12/883,652 dated Apr. 17, 2012 (7 pages).

USPTO Office Action for U.S. Appl. No. 12/884,993 dated Mar. 16, 2012 (12 pages).

USPTO Notice of Allowance for U.S. Appl. No. 12/884,993 dated Nov. 26, 2012 (6 pages).

USPTO Notice of Allowance for U.S. Appl. No. 13/163,498 dated Jul. 23, 2012 (4 pages).

USPTO Notice of Allowance for U.S. Appl. No. 13/298,617 dated Sep. 13, 2013 (11 pages).

(56) References Cited

OTHER PUBLICATIONS

USPTO Office Action for U.S. Appl. No. 13/304,182 dated May 9, 2014 (12 pages).
USPTO Notice of Allowance for U.S. Appl. No. 13/304,182 dated Aug. 27, 2014 (8 pages).
USPTO Office Action for U.S. Appl. No. 13/354,639 dated Nov. 7, 2012 (11 pages).
USPTO Notice of Allowance for U.S. Appl. No. 13/354,639 dated Dec. 14, 2012 (8 pages).
USPTO Office Action for U.S. Appl. No. 13/465,976 dated Aug. 16, 2012 (16 pages).
USPTO Office Action for U.S. Appl. No. 13/465,976 dated Dec. 20, 2012 (16 pages).
USPTO Office Action for U.S. Appl. No. 13/465,976 dated Aug. 25, 2014 (21 pages).
USPTO Office Action for U.S. Appl. No. 13/491,483 dated Jan. 16, 2014 (9 pages).
USPTO Office Action for U.S. Appl. No. 13/491,483 dated Jun. 27, 2014 (8 pages).
USPTO Notice of Allowance for U.S. Appl. No. 13/491,483 dated Sep. 18, 2014 (7 pages).
USPTO Office Action for U.S. Appl. No. 13/538,426 dated Nov. 21, 2014 (15 pages).
USPTO Office Action for U.S. Appl. No. 13/904,237 dated May 22, 2014 (13 pages).
USPTO Office Action for U.S. Appl. No. 14/181,386 dated Oct. 28, 2014 (10 pages).

* cited by examiner

US 9,646,827 B1

METHOD FOR SMOOTHING SURFACE OF A SUBSTRATE CONTAINING GALLIUM AND NITROGEN

This application claims the benefit of U.S. Provisional Application No. 61/526,355, filed on Aug. 23, 2011, which is incorporated by reference in its entirety.

BACKGROUND OF THE INVENTION

The invention is directed to optical devices. With the advent of semiconductor devices and applications thereof, GaN materials are being used for fabricating light emitting diodes (LEDs), lasers, and other types of devices. Typically, LEDs are formed over sapphire, silicon carbide, and on gallium nitride (GaN) substrates.

To form devices (e.g., LED or laser devices) over a GaN substrate, it is desirable to have a smooth surface. In the past, various processing techniques have been developed to achieve this goal. Unfortunately, conventional techniques have been inadequate.

SUMMARY OF THE INVENTION

Embodiments provided by the present disclosure are directed to optical devices. More specifically, embodiments of the invention provide a method for processing GaN based substrate material that can be used for manufacturing light-emitting diode, laser, and other types of devices. In various embodiments, a GaN substrate is exposed to gaseous species, which includes nitrogen and hydrogen material, at a high temperature for a predetermined period of time, and this process causes the surface of the GaN substrate to become smooth. Other processes, such as growing epitaxial layers over the surface of GaN substrate, are performed over the smooth surface of the GaN substrate.

In one embodiment, the invention provides a method for manufacturing semiconductor devices. The method includes providing a substrate. The substrate comprises gallium, and/or other Group III material, and nitrogen containing material. The substrate includes a top surface, which has scratches characterized by a depth of at least 8 nm. The method also includes providing a processing apparatus, which can be a chemical vapor deposition (CVD) apparatus. The CVD apparatus includes a chamber that has an initial temperature of between 10° C. and 60° C. The method additionally includes placing the substrate within the chamber of the CVD apparatus. The method also includes providing $H_2$ and $NH_3$ gaseous species within the chamber. Depending on the application, other types of gaseous species may be present within the chamber, such as $N_2$, Ar, He, and others. Moreover, the method includes increasing the chamber temperature to a second temperature over a first time period. The second temperature is at least 900° C., but can also be greater than 1,000° C. The substrate may optionally be exposed to one or more of Group-III material during the second time period.

The method also includes subjecting the substrate to the second temperature for a second time period of about 5 minutes to 30 minutes. In addition, the method includes causing the top surface of the substrate to anneal at the second temperature. The plurality of scratches/trenches on the top surface of the substrate is characterized by a second scratch/trench depth of less than 2 nm as a result of the annealing. In various embodiments, at least a portion of the annealed substrate surface may be characterized by an RMS roughness of less than 0.05 nm over an area of 25 μm². The terms scratches and trenches are used interchangeably herein to refer to substrate surface defects.

The method may include additional steps as well. For example, the method may include injecting $NH_3$ into the chamber at a second temperature at a flow rate of 8 slpm. The method can also include forming epitaxial layers over the top surface. The method may additionally include doping the substrate with indium material over the annealed top surface. The top surface of the substrate may be polished before loading into the CVD chamber. Alternatively, the substrate could then be transferred to a second chamber (part of the same or different apparatus) for further thermal treatment and/or epitaxial growth/deposition.

During the first time period, as the temperature within the chamber increases, the top surface may have a temperature of about 100° C. less than the second temperature. The first time period can be about 12 minutes to 18 minutes. The second time period can be about 10 minutes.

The substrate, with a nitridation process performed over its surface, can be used to manufacture various types of devices, such as LED chips, power electronic devices, and others. To form LED chips using the substrate, the method may also include forming a rectifying device structure over the annealed surface. For example, the method can include forming a transistor device structure over the annealed surface. Prior to, or after the nitridation process, the substrate may optionally be patterned using conventional wet/dry etching techniques, or using metal/dielectric masks such as $SiO_2$, SiN, or others.

According to another embodiment, the invention provides a method for manufacturing semiconductor devices. The method includes providing a substrate. The substrate comprises gallium and nitrogen containing material. The substrate has a top surface, which comprises a plurality of scratches characterized by a first scratch depth of at least 8 nm. The method also includes providing a chemical vapor deposition (CVD) apparatus. The CVD apparatus has a chamber, which has an initial temperature of between 10° C. and 60° C. The method also includes placing the substrate within the chamber of the CVD apparatus. Additionally, the method includes increasing the chamber temperature to a second temperature for a first period of time. The second temperature is at least 900° C. The method additionally includes subjecting the substrate to the second temperature for a second period of time about 5 minutes to 30 minutes and filling $NH_3$ gaseous species into the chamber at a flow rate of at least 5 slpm. The method also includes causing the top surface of the substrate to anneal at the second temperature. The plurality of trenches on the top surface of the substrate is characterized by a second trench depth of less than 2 nm as a result of the annealing. The method also includes forming one or more epitaxial layers over the annealed surface.

In certain embodiments, method for manufacturing semiconductor devices are disclosed, the methods comprising: providing a substrate, the substrate comprising gallium and nitrogen containing material, the substrate having a top surface, the top surface comprising a plurality of scratches characterized by a first depth of at least 8 nm; providing a processing apparatus, the processing apparatus having a chamber, the chamber having an initial temperature of between 10 to 60° C., the apparatus being configured to cause the chamber to reach a temperature of at least 900° C. and change gas ambient within the chamber; placing the substrate within the chamber of the processing apparatus; providing $H_2$ and $NH_3$ gaseous species within the chamber; increasing the chamber temperature to a second temperature over a first time period, the second temperature being at least 900° C.; subjecting the substrate to the second temperature for a second time period of about 5 minutes to 30 minutes; and causing the top surface of the substrate to anneal at the second temperature, the plurality of scratches on the top surface of the substrate being characterized by a second depth of less than 2 nm as a result of the annealing, to provide an annealed substrate surface.

In certain embodiments, methods for manufacturing semiconductor devices are provided, the method comprising: providing a substrate, the substrate comprising gallium and nitrogen containing material, the substrate having a top surface, the top surface comprising a plurality of scratches characterized by a first depth of at least 8 nm; providing a processing apparatus, the processing apparatus having a chamber, the chamber having an initial temperature of between 10 to 60° C.; placing the substrate within the chamber of the processing apparatus; increasing the chamber temperature to a second temperature over a first time period, the second temperature being at least 1,300° C.; subjecting the substrate to the second temperature for a second time period of about 5 minutes to about 30 minutes and filling $NH_3$ gaseous species into the chamber at a flow rate of at least 5 slpm; causing the top surface of the substrate to anneal at the second temperature, the plurality of scratches on the top surface of the substrate being characterized by a second depth of less than 2 nm as a result of the annealing to provide an annealed substrate surface; and forming one or more epitaxial layers over the anneal surface.

It is to be appreciated that embodiments of the invention provide numerous advantages compared to conventional techniques. Among other things, embodiments of the invention provide a process that smooth substrate surfaces, and/or reduces subsurface damage and extended defect density, thereby making the processed substrate better suited for forming various types of devices, such as LED chips, power electronics, etc.

BRIEF DESCRIPTION OF THE DRAWINGS

The accompanying drawings, which are incorporated in and constitute a part of this specification, illustrate embodiments consistent with the present disclosure and, together with the description, serve to explain the principles of the disclosed embodiments. Those skilled in the art will understand that the drawings, described herein, are for illustration purposes only. The drawings are not intended to limit the scope of the present disclosure.

DETAILED DESCRIPTION OF THE INVENTION

As mentioned above, GaN substrates with a smooth surface are desirable. Often, achieving a smooth surface prior to the growth of an active region is a requirement for achieving high performance devices, such as LEDs and laser diodes. A smooth growth surface can provide many benefits, such as:

1. Sharp interfaces between layers;
2. Minimize roughness-induced scattering, thereby resulting in higher carrier mobility;
3. Reduced point defect densities;
4. Uniform alloy, dopant composition indium incorporation across wafer; and/or
5. Prevents 3-D growth mode.

Achieving a smooth surface morphology is often difficult, especially for bulk GaN substrates. An in-situ surface treatment is often required to generate the step-structure, required for 2-D step-flow growth mode. The surface treatment is usually carried out in-situ and consists of ramping the temperature in a growth chamber in ammonia and hydrogen ambient, followed by nitridation of the GaN surface at an elevated temperature for a fixed amount of time. The optimum nitridation time, temperature, $NH_3$ flow rate, $H_2$ flow rate, etc. are determined empirically.

Figure 1:
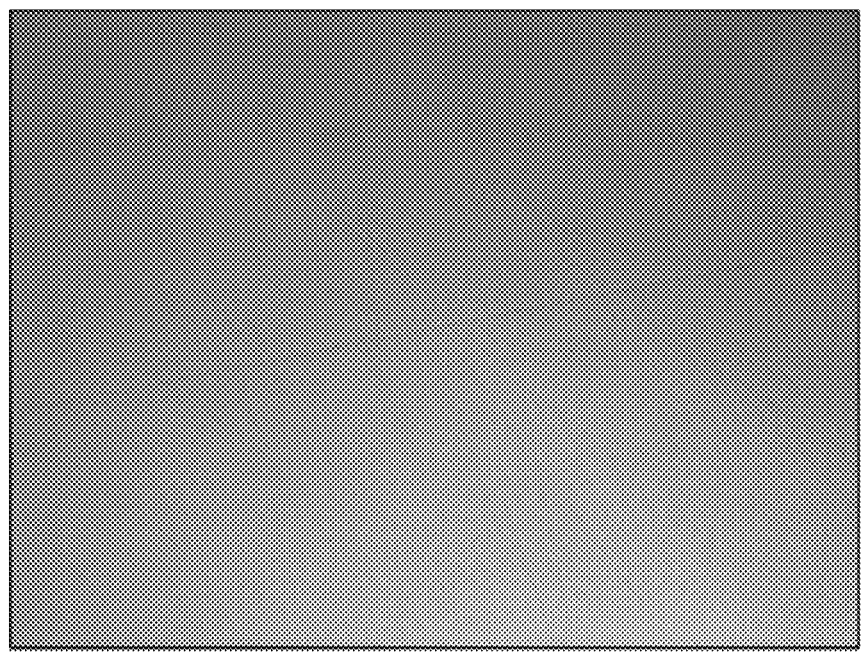
FIG. 1 is a diagram showing the optical microscope image of the surface morphology of as-received bulk GaN substrate.
Figure 2:
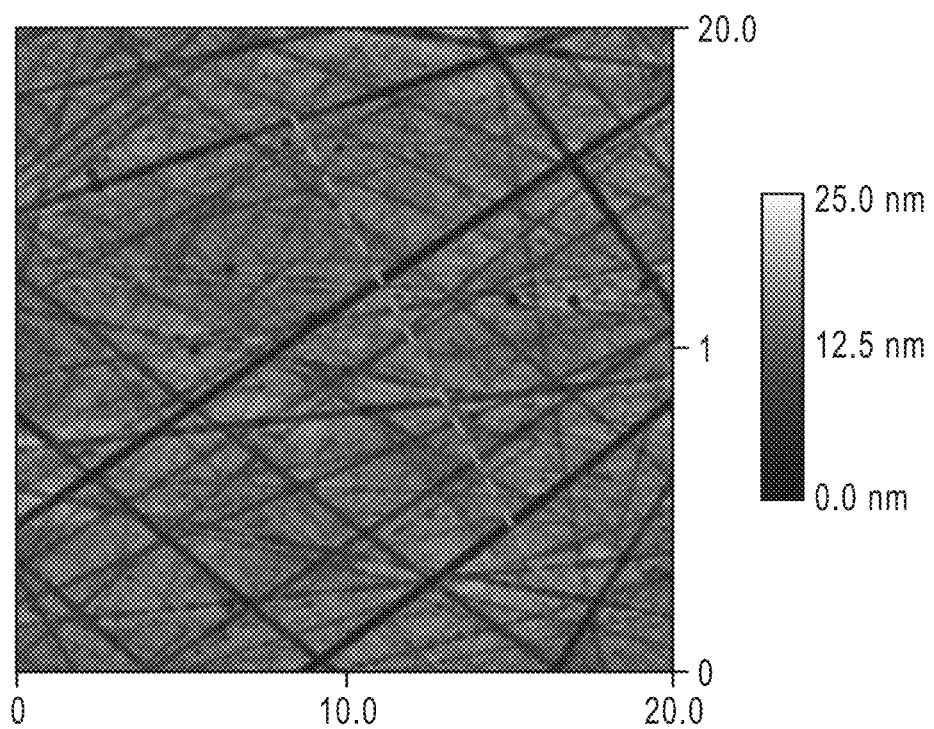
FIG. 2 shows an atomic force microscope (AFM) image of the as-received surface. The deep scratches are clearly visible on the surface.
Figure 3:
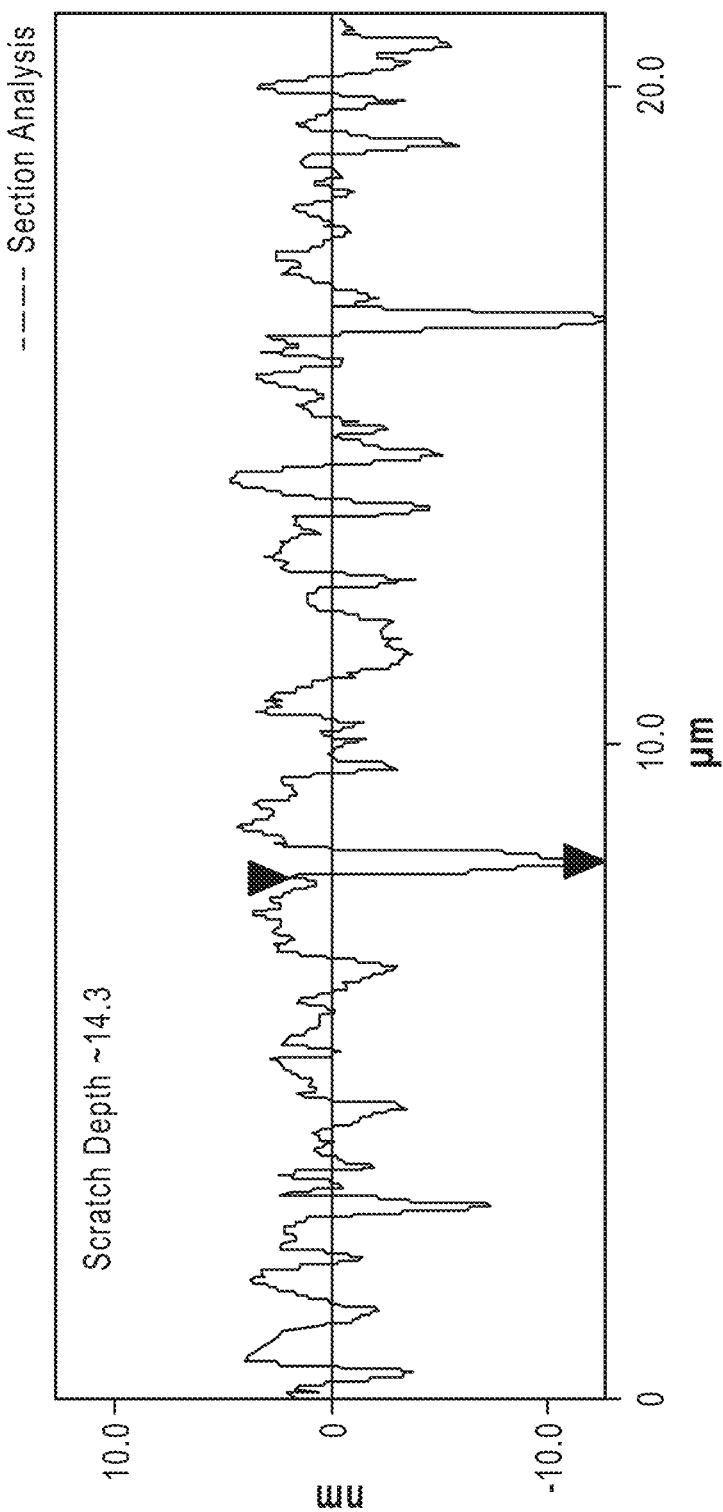
FIG. 3 is a diagram of a section analysis illustrating scratch depth, which can range from few nanometers to up to 14.3 nm as shown, along the section denoted in FIG. 2.

FIG. 1 is an optical microscope image of the surface morphology of as-received bulk GaN substrate. As shown, the optical image shows a very high density of scratches, which are most likely made during the polishing process. These scratches render the GaN substrate surface uneven, which is undesirable for the reasons explained above. FIG. 2 shows an atomic force microscope (AFM) image of the as-received GaN surface. The deep scratches are clearly visible on the surface. The area of the AFM image is 20×20 $nm^2$ and the depth of the scratches as characterized by Z-range is 25 nm. FIG. 3 shows a section analysis illustrating scratch depth, which can range from a few nanometers up to 14.3 nm as shown.

Figure 4:
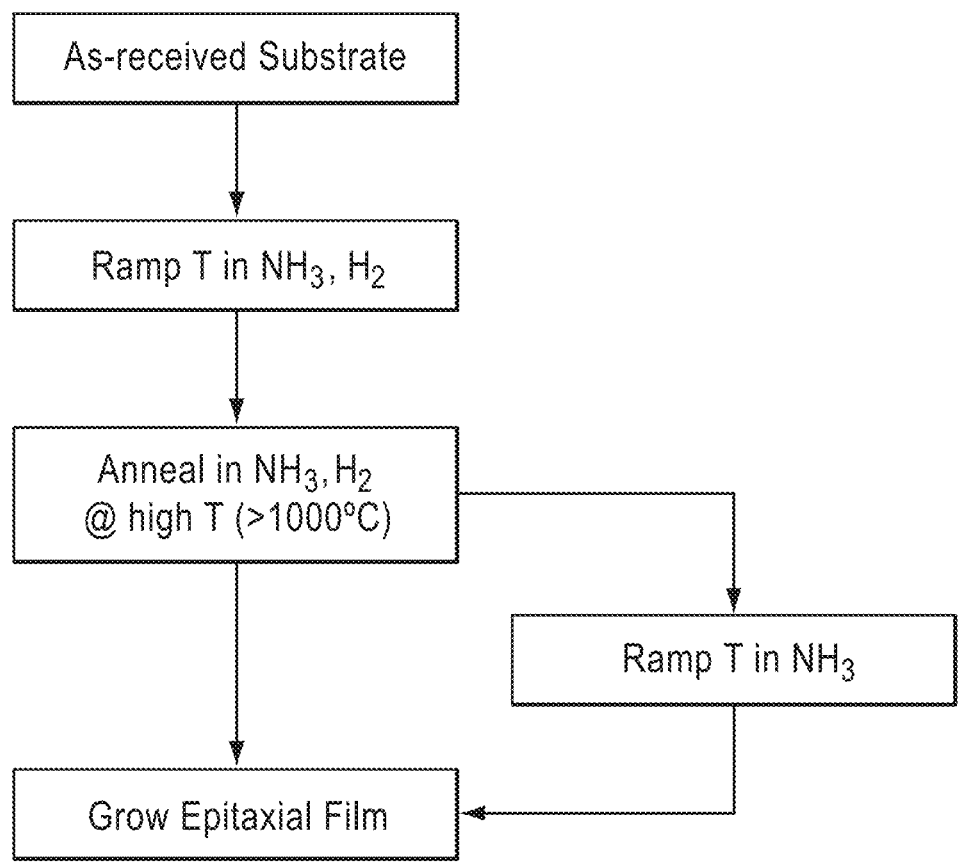
FIG. 4 is a diagram showing the process flow of the nitridation step prior to the growth of the epitaxial layers.

FIG. 4 is a simplified diagram showing the process flow of the nitridation step prior to the growth of the epitaxial layers according to an embodiment of the invention. First, a substrate is provided. For example, the substrate consists substantially of gallium and nitrogen containing materials. As explained above, the substrate may have an uneven surface with many scratches. Depending on the application, the received substrate may be polished. Active regions are to be defined and formed over the substrate. The substrate, as received, is loaded in an MOCVD chamber. For example, the initial temperature at the MOCVD temperature is at a relatively temperature of about 20° C. to about 50° C. Next, with $NH_3$ and $H_2$ gas species filled within the MOCVD chamber, the temperature is increased to at least a predetermined temperature of about 1,050° C. s over a time period of about 15 minutes.

It is to be appreciated that depending on the application, the temperature and the temperature ramp time may be changed. For example, the MOCVD chamber can have a thermal couple temperature of greater than 1,000° C. In an embodiment, during the temperature ramp stage r, the $NH_3$ flow is about 8 slpm and total $H_2$ flow is about 31 slpm. Among other things, the $NH_3$ gas preserves the surface of the substrate. Once the temperature at the MOCVD reaches the predetermined temperature, the substrate stays in the MOCVD chamber for a period of time (e.g., about 10 minutes) with the $NH_3$ flow at about 8 slpm and total $H_2$ flow at about 31 slpm, which substantially anneals the surface and enhances the smoothness and uniformity of the substrate surface. The amount of time for annealing the substrate surface varies, which can be from 5 minutes to 20 minutes. For example, the annealing process with the $NH_3$ gaseous species can be referred as a nitridation process.

After the substrate bas been subject to both high temperature and $NH_3$ and $H_2$ within the MOCVD chamber, the surface of the substrate is smoothed and thus the substrate can be used for forming various types of devices. In an embodiment, an epitaxial film is formed over the smooth surface of the substrate. For example, the epitaxial film growth can be performed after the annealing process or after another ramp up in chamber temperature with $NH_3$ material, as epitaxial film can be grown in high or low temperature.

Figure 5:
FIG. 5 is an AFM micrograph of the substrate surface after the nitridation process.

FIG. 5 is an AFM micrograph illustrating substrate surface after nitridation process is performed according to embodiments of the invention. As shown in FIG. 5, a smooth surface morphology can be observed after nitridation.

Figure 6C:
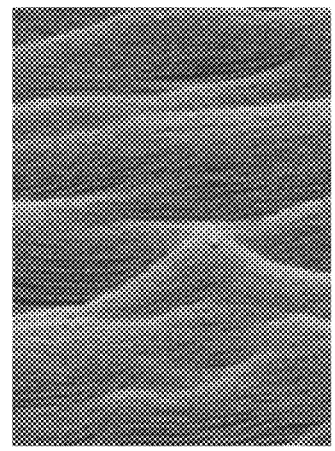
FIGS. 6A-6E illustrate the surface texture observed after nitridation at various temperatures. The surfaces shown in FIG. 6A and FIG. 6D were annealed at 1,000° C.; the surfaces shown in FIG. 6B and FIG. 6E were annealed at 1,050° C.; and the surfaces shown in FIG. 6C and FIG. 6F were annealed at 1,100° C. The surface area shown in each of FIGS. 6A, 6B, and 6C is 10×10 $\mu m^2$. The surface area shown in each of FIGS. 6D, 6E, and 6F is 3×3 $\mu m^2$.
Figure 6F:
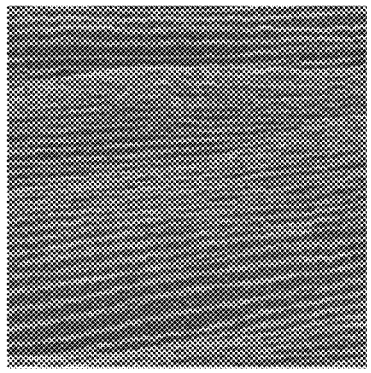
Figure 6B:
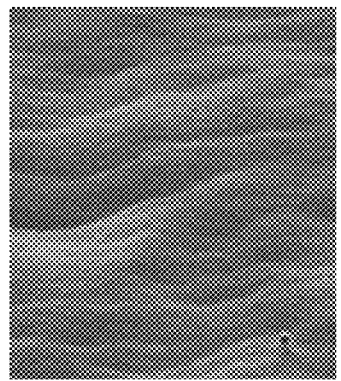
Figure 6E:
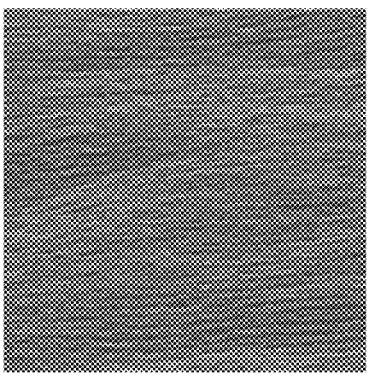
Figure 6A:
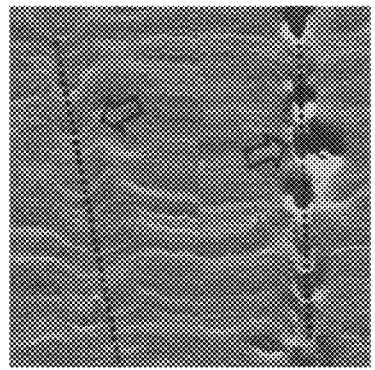
Figure 6D:
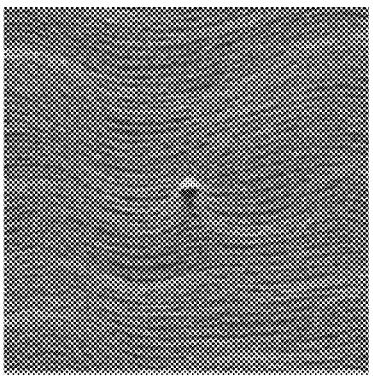

FIGS. 6A-6F illustrates surface texture observed after nitridation is performed at different temperatures according to embodiments of the invention. As shown in FIG. 6, smooth surface can be achieved by performing nitridation at 1,050° C. At different temperature levels, a nitridation process can have a different effect on surface smoothness. For example, nitridation at 1,000° C. or 1,100° C. can result in a different level of surface smoothness. For example, the nitridation temperature may vary from 800° C. to 1,200° C. As shown in FIG. 6A, steps on the substrate surface appear to curve around the scratches. As shown in FIG. 6C, after nitridation, the annealed substrate surface is characterized by defined terraces and ridges.

Figure 7C:
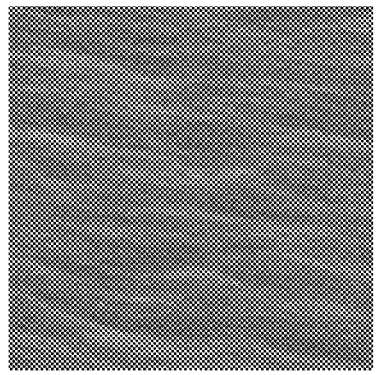
FIGS. 7A-7E illustrate the surface texture observed after nitridation for various times. The figures show surfaces anneal at 1,100° C. for 0 minutes (FIG. 7A and FIG. 7D), for 10 minutes (FIG. 7B and FIG. 7E), and for 20 minutes (FIG. 7C and FIG. 7F). The surface area shown in each of FIGS. 7A, 7B, and 7C is 10×10 $\mu m^2$. The surface area shown in each of FIGS. 7D, 7E, and 7F is 3×3 $\mu m^2$.
Figure 7F:
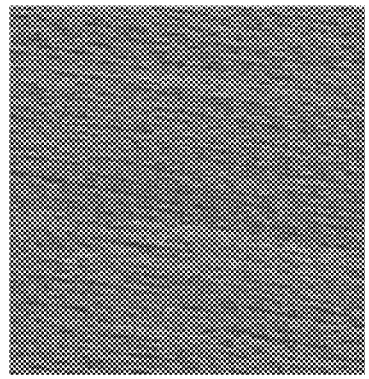
Figure 7B:
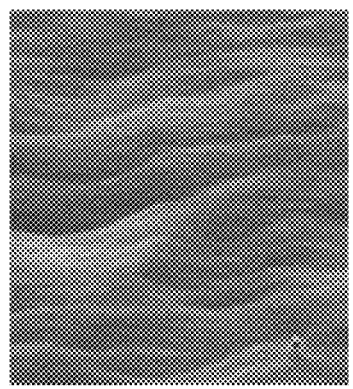
Figure 7E:
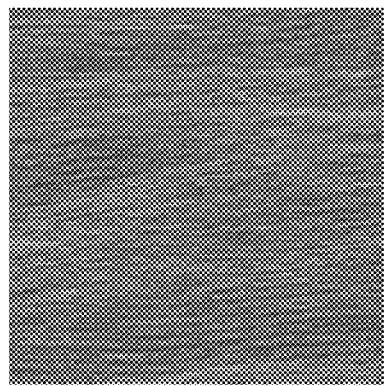
Figure 7A:
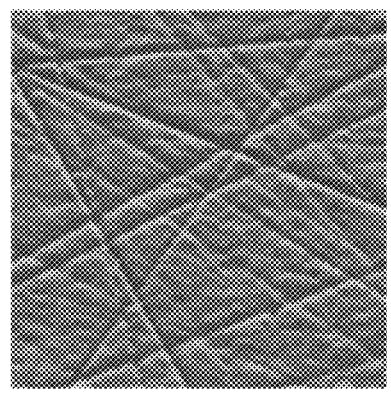
Figure 7D:
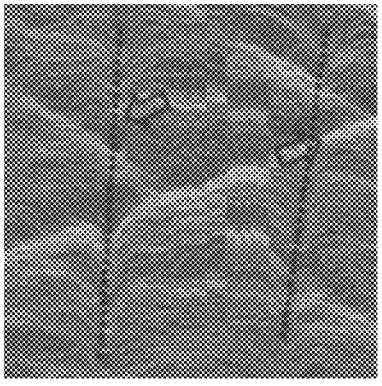

FIG. 7A-7F illustrates surface texture observed after nitridation is performed for different durations according to embodiments of the invention. As shown, many scratches are present on the surface of the substrate if a (i.e., 0 minute) nitridation process is performed. At 10 minutes or 20 minutes of nitridation, the surface of the substrate can be much smoother. For example, during the nitridation process can vary from 3 minutes to over 20 minutes. For example, various nitridation conditions may lead to dissimilar step structure on substrates with different characteristics, such as miscut, variation, surface finish, polish, thickness, doping, and others. In certain embodiments, optimal nitridation conditions are to be varied according to the substrate surface. As shown in FIG. 7D, steps appear to curve around scratches on the unannealed substrate surface.

The nitridation process illustrated in FIG. 4 and described above provides several advantages. Among other things, the mechanism that results in smooth surface morphology can be attributed to surface-desorption and mass-transport effects.

According to an embodiment, the invention provides a method for manufacturing semiconductor devices. The method includes providing a substrate. The substrate comprises gallium and nitrogen containing material. The substrate includes a top surface, which comprises a plurality of scratches characterized by a first scratch depth of at least 8 nm. The method also includes providing a chemical vapor deposition (CVD) apparatus. The CVD apparatus includes a chamber that has an initial temperature of between 10° C. and 60° C. The method additionally includes placing the substrate within the chamber of the CVD apparatus. The method also includes providing $H_2$ and $NH_3$ gaseous species within the chamber. Moreover, the method includes increasing the chamber temperature to a second temperature over a first time period. The second temperature is at least 900° C., but can also be greater than 1,000° C. The substrate is exposed to one or more of Group-III material during the second time period.

The method also includes subjecting the substrate to the second temperature for a second time period of about 5 minutes to 30 minutes. In addition, the method includes causing the top surface of the substrate to anneal at the second temperature. The plurality of trenches on the top surface of the substrate is characterized by a second trench depth of less than 2 nm as a result of the annealing. In various embodiments, at least a portion of the annealed surface may be characterized by an RMS roughness of less than 0.05 nm over an area of 25 $\mu m^2$.

The method above may include additional steps as well. For example, the method includes injecting $NH_3$ into the chamber at the second temperature at a flow rate of 8 slpm. The method can also include forming one or more epitaxial layers over the top surface of the smooth substrate. The method may additionally include doping the smooth substrate with indium material over the annealed top surface. The top surface of the substrate may be polished before loading into the CVD chamber.

During the first time period as the temperature within the chamber increases, the top surface of the substrate may have a temperature of about 100° C. less than the second temperature. The first time period can be about 12 minutes to about 18 minutes. The second time period can be about 10 minutes.

The substrate, with the nitridation process performed over its surface, can be used to manufacture various types of devices, such as LED chips, power electronic devices, and others. To form LED chips using the smooth substrate, the method may also include forming a rectifying device structure over the annealed surface. For example, the method can include forming a transistor device structure over the annealed surface.

According to another embodiment, the invention provides a method for manufacturing semiconductor devices. The method includes providing a substrate. The substrate comprises gallium and nitrogen containing material. The substrate has a top surface, which comprises a plurality of scratches characterized by a first scratch depth of at least 8 nm. The method also includes providing a chemical vapor deposition (CVD) apparatus. The CVD apparatus has a chamber, which has an initial temperature of between 10° C. and 60° C. The method also includes placing the substrate within the chamber of the CVD apparatus. Additionally, the method includes increasing the chamber temperature to a second temperature over a first time period. The second temperature is at least 900° C. The method additionally includes subjecting the substrate to the second temperature for a second time period of about 5 minutes to 30 minutes and filling $NH_3$ gaseous species into the chamber at a flow rate of at least 5 slpm. The method also includes causing the top surface of the substrate to anneal at the second temperature. The plurality of trenches on the top surface of the substrate is characterized by a second trench depth of less than 2 nm as a result of the annealing. The method also includes forming one or more epitaxial layers over the annealed surface.

While the above is a full description of the specific embodiments, various modifications, alternative constructions and equivalents may be used. Therefore, the above description and illustrations should not be taken as limiting the scope of the invention which is defined by the appended claims.

What is claimed is:

1. A method for smoothing a substrate for epitaxial growth, said substrate comprising at least a gallium and nitrogen containing material, and having a top surface, at least a portion of said top surface having a first RMS roughness, the method comprising:
    heat treating said substrate to form an annealed substrate surface; and wherein said heat treating comprises at least a first step and a second step, in said first step, subjecting said substrate to a first temperature of at least about 1000° C. for a first time period of about 5 minutes to about 30 minutes in the presence of $H_2$ and $NH_3$, and, in said second step, after said first step, subjecting the substrate to a second temperature, substantially higher than said first temperature for a second time period in the presence of at least $NH_3$ to form said annealed substrate surface wherein, after said first step, said at least a portion of said top surface comprises a first surface smoothness, and after said second step, said at least a portion of said top surface comprises a second surface smoothness different than said first surface smoothness and defined by a second RMS roughness less than said first RMS roughness, and
    wherein said heat treating occurs prior to epitaxial growth.

2. The method of claim 1, wherein said first step comprises providing $NH_3$ at a flow rate of 8 slpm.

3. The method of claim 1, further comprising forming one or more epitaxial layers over the top surface of said top surface.

4. The method of claim 3, wherein forming one or more epitaxial layers over the top surface of said top surface using a chemical vapor deposition.

5. The method of claim 1, further comprising forming LED chips using said top surface.

6. The method of claim 1, wherein the first time period is 12 minutes to 18 minutes.

7. The method of claim 1, wherein the second time period is 10 minutes.

8. The method of claim 1, wherein said second step comprises exposing the substrate to one or more Group-III materials during the second time period.

9. The method of claim 1, further comprising polishing the top surface of the substrate before placing the substrate in the processing apparatus.

10. The method of claim 1, further comprising forming a rectifying device structure over the annealed substrate surface.

11. The method of claim 1, further comprising forming a transistor device structure over the annealed substrate surface.

12. The method of claim 1, wherein said second RMS roughness is less than 0.1 nm over an area of 25 $\mu m^2$.

13. The method of claim 3, wherein the one or more epitaxial layers are formed at a temperature of at least 800° C.

14. The method of claim 13, wherein the one or more epitaxial layers are formed at a temperature of less than 1,000° C.

15. The method of claim 1, wherein the substrate has a surface orientation characterized by a polar, non-polar, or semi-polar crystal orientation.

16. The method of claim 3, further comprising forming contact regions over the one or more epitaxial layers.

17. The method of claim 3, further comprising performing an etching process over the annealed substrate surface.

18. The method of claim 1, further comprising polishing the top surface of the substrate before the substrate is subjected to said first step.

19. The method of claim 1, further comprises forming a rectifying device structure over said top surface.

20. The method of claim 3, further comprising separating said top surface from the one or more epitaxial layers.

21. The method of claim 1, wherein,
    in said first step, said $H_2$ is provided at a flow rate of 31 slpm, and said $NH_3$ is provided at a flow rate of 8 slpm; and
    in said second step, said $NH_3$ is provided at a flow rate of 8 slpm.

22. The method of claim 12, wherein said second RMS roughness is less than 0.05 nm over an area of 25 $\mu m^2$.

23. The method of claim 1, wherein said substrate comprises a plurality of defects having a first depth of at least 8 nm before said heat treating, said plurality of defects having a second depth of less than 2 nm after said heat treating.

24. The method of claim 1, wherein said first temperature is about 1050° C. to about 1100° C.

25. The method of claim 1, wherein said second temperature is at least about 1300° C.

26. The method of claim 1, wherein during said heat treating said substrate, nothing is grown on the substrate.

* * * * *